US012684700B2

(12) United States Patent (10) Patent No.: US 12,684,700 B2
Nakamura et al. (45) Date of Patent: Jul. 14, 2026

(54) STRETCHABLE DEVICE

(71) Applicant: Murata Manufacturing Co., Ltd., Nagaokakyo (JP)

(72) Inventors: Yui Nakamura, Nagaokakyo (JP); Hiromitsu Ito, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 44 days.

(21) Appl. No.: 18/819,312

(22) Filed: Aug. 29, 2024

(65) Prior Publication Data

US 2024/0422918 A1     Dec. 19, 2024

Related U.S. Application Data

(63) Continuation of application No. PCT/JP2023/005475, filed on Feb. 16, 2023.

(30) Foreign Application Priority Data

Mar. 8, 2022     (JP) ................................. 2022-035568

(51) Int. Cl.
H05K 3/36          (2006.01)
(52) U.S. Cl.
CPC ................................... H05K 3/361 (2013.01)
(58) Field of Classification Search
CPC ....................................................... H05K 3/361
USPC ......................................................... 349/150
See application file for complete search history.

(56) References Cited

U.S. PATENT DOCUMENTS

| | | | | |
|---|---|---|---|---|
| 9,040,839 | B2 * | 5/2015 | Furuta | H05K 3/361 |
| | | | | 174/117 FF |
| 10,398,024 | B2 * | 8/2019 | Iwase | B32B 27/20 |
| 2012/0026700 | A1 * | 2/2012 | Furuta | H05K 3/361 |
| | | | | 361/750 |
| 2020/0291274 | A1 * | 9/2020 | Iwase | A61N 1/0492 |
| 2024/0179835 | A1 * | 5/2024 | Hori | H05K 1/145 |
| 2024/0422919 | A1 * | 12/2024 | Ito | H05K 3/361 |
| 2025/0089177 | A1 * | 3/2025 | Asukai | H05K 1/02 |

FOREIGN PATENT DOCUMENTS

| | | |
|---|---|---|
| JP | H03-230595 A | 10/1991 |
| JP | H08-181430 A | 7/1996 |
| JP | 2004-095955 A | 3/2004 |
| JP | 2006-154621 A | 6/2006 |
| JP | 2007-035546 A | 2/2007 |
| JP | 2012-033597 A | 2/2012 |

(Continued)

OTHER PUBLICATIONS

International Search Report received for PCT Patent Application No. PCT/JP2023/005475, mailed on Apr. 25, 2023, 3 pages (English Translation only).

*Primary Examiner* — Christopher M Raabe
(74) *Attorney, Agent, or Firm* — ArentFox Schiff LLP

(57) ABSTRACT

A stretchable device that includes: a first substrate; a stretchable first wiring on the first substrate; a second substrate facing the first substrate in a first direction that is a thickness direction of the first substrate; a second wiring on the second substrate and facing the first wiring in the first direction; a connection member electrically connecting the first wiring and the second wiring; and a first protective layer at least between the second substrate and the first wiring in the first direction.

20 Claims, 9 Drawing Sheets

(56)          References Cited

FOREIGN PATENT DOCUMENTS

| JP | 2013-051352 | A  | 3/2013 |
| JP | 2013-135172 | A  | 7/2013 |
| JP | 2019-075490 | A  | 5/2019 |
| WO | 2016/152543 | A1 | 9/2016 |

* cited by examiner

STRETCHABLE DEVICE

CROSS REFERENCE TO RELATED APPLICATIONS

The present application is a continuation of International application No. PCT/JP2023/005475, filed Feb. 16, 2023, which claims priority to Japanese Patent Application No. 2022-035568, filed Mar. 8, 2022, the entire contents of each of which are incorporated herein by reference.

TECHNICAL FIELD

The present disclosure relates to a stretchable device.

BACKGROUND ART

In addition, conventionally, electrical connection between substrates having main surfaces on which electrodes or wirings are provided has been performed.

Patent Document 1 describes a pressure bonding device and a pressure bonding method for connecting electrode terminals of substrates with a conductive connection material interposed therebetween in a technique for connection between the electrode terminals. Specifically, the first electrode terminal provided on the first substrate and the second electrode terminal provided on the second substrate are disposed so as to face each other, and are connected to each other by thermal pressure bonding using a heater bar.

Patent Document 1: Japanese Patent Application Laid-Open No. 2007-35546

SUMMARY OF THE DISCLOSURE

By the way, when a stretchable wiring as the first electrode terminal and an electrode or a wiring as the second electrode terminal are to be connected, if the connection method described in Patent Document 1 is used, the second substrate on which the electrode or the wiring is provided comes into contact with the stretchable wiring, and the stretchable wiring may be broken. Alternatively, expansion and contraction of the stretchable wiring is hindered by the contact of the second substrate, and the stretchable wiring may become a starting point of breakage. That is, when the second substrate is in direct contact with the stretchable wiring, the stretchable wiring may be easily broken.

Therefore, the present disclosure provides a stretchable device capable of connecting substrates while reducing the possibility of breakage of a stretchable wiring.

In order to achieve the above object, a stretchable device according to an aspect of the present disclosure includes: a first substrate; a stretchable first wiring on the first substrate; a second substrate facing the first substrate in a first direction that is a thickness direction of the first substrate; a second wiring on the second substrate and facing the first wiring in the first direction; a connection member electrically connecting the first wiring and the second wiring; and a first protective layer at least between the second substrate and the first wiring in the first direction.

According to the stretchable device according to the aspect of the present disclosure, it is possible to connect the substrates while reducing the possibility of breakage.

DESCRIPTION OF THE PREFERRED EMBODIMENTS

Figure 1A:
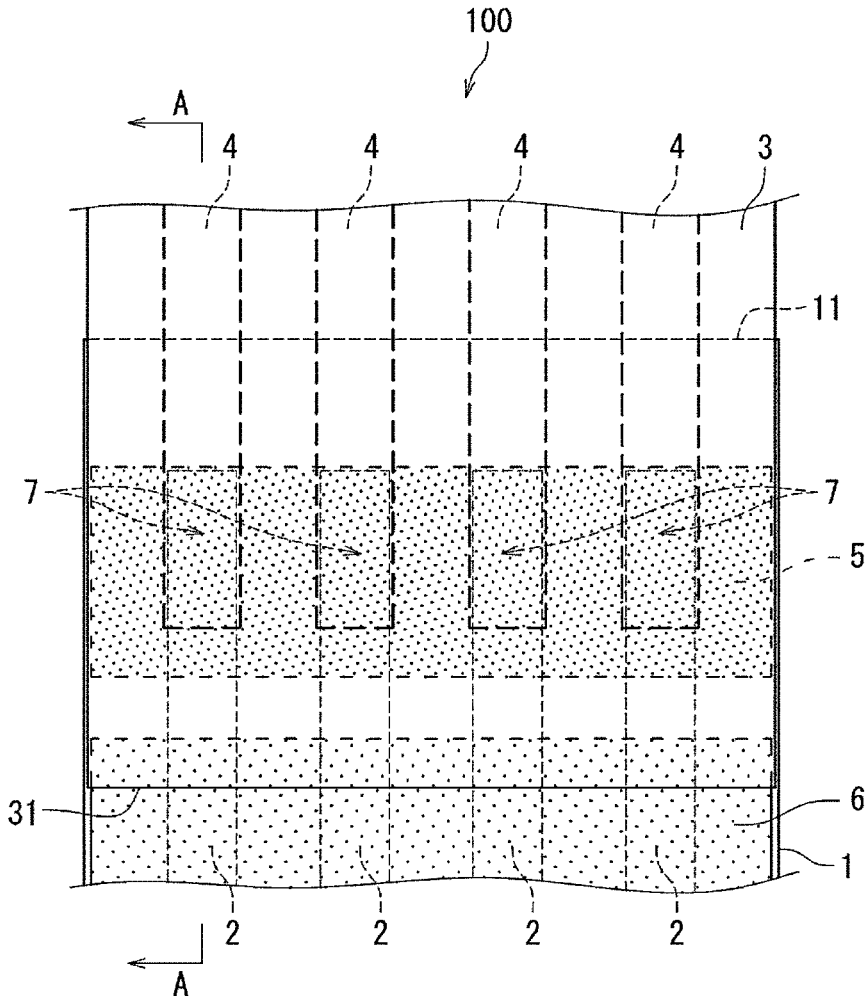
FIG. 1A is a partial enlarged top view schematically illustrating a stretchable device according to a first embodiment of the present disclosure.

Hereinafter, embodiments of the present disclosure will be described in detail with reference to the drawings. In each embodiment, a difference from description before the embodiment will be mainly described. Particularly, similar functions and effects achieved by similar configurations will not be mentioned sequentially for each embodiment. Among constituent elements in an embodiment below, a constituent element not described in an independent claim is described as an optional constituent element. Further, sizes and ratios of sizes of constituent elements illustrated in the drawings are not necessarily strict. Further, in the drawings, substantially the same configurations are denoted by the same reference numerals, and redundant description may be omitted or simplified.

First Embodiment

Figure 1B:
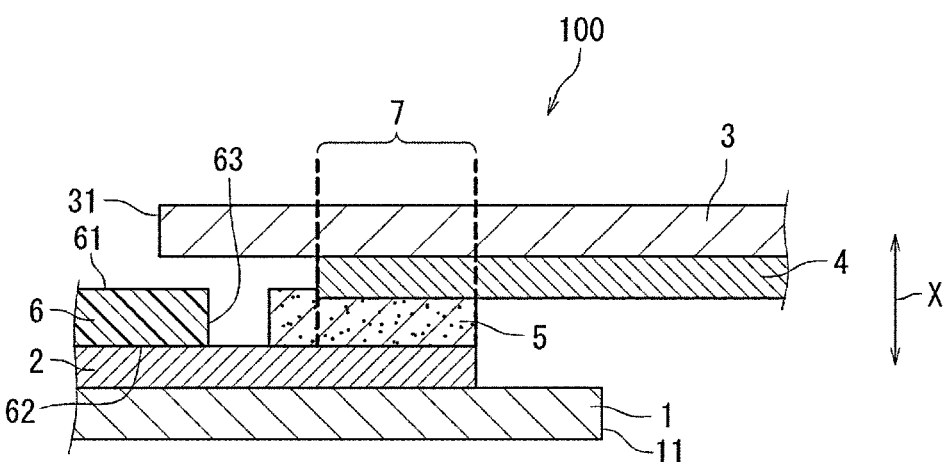
FIG. 1B is a sectional view taken along line A-A in FIG. 1A.
Figure 2:
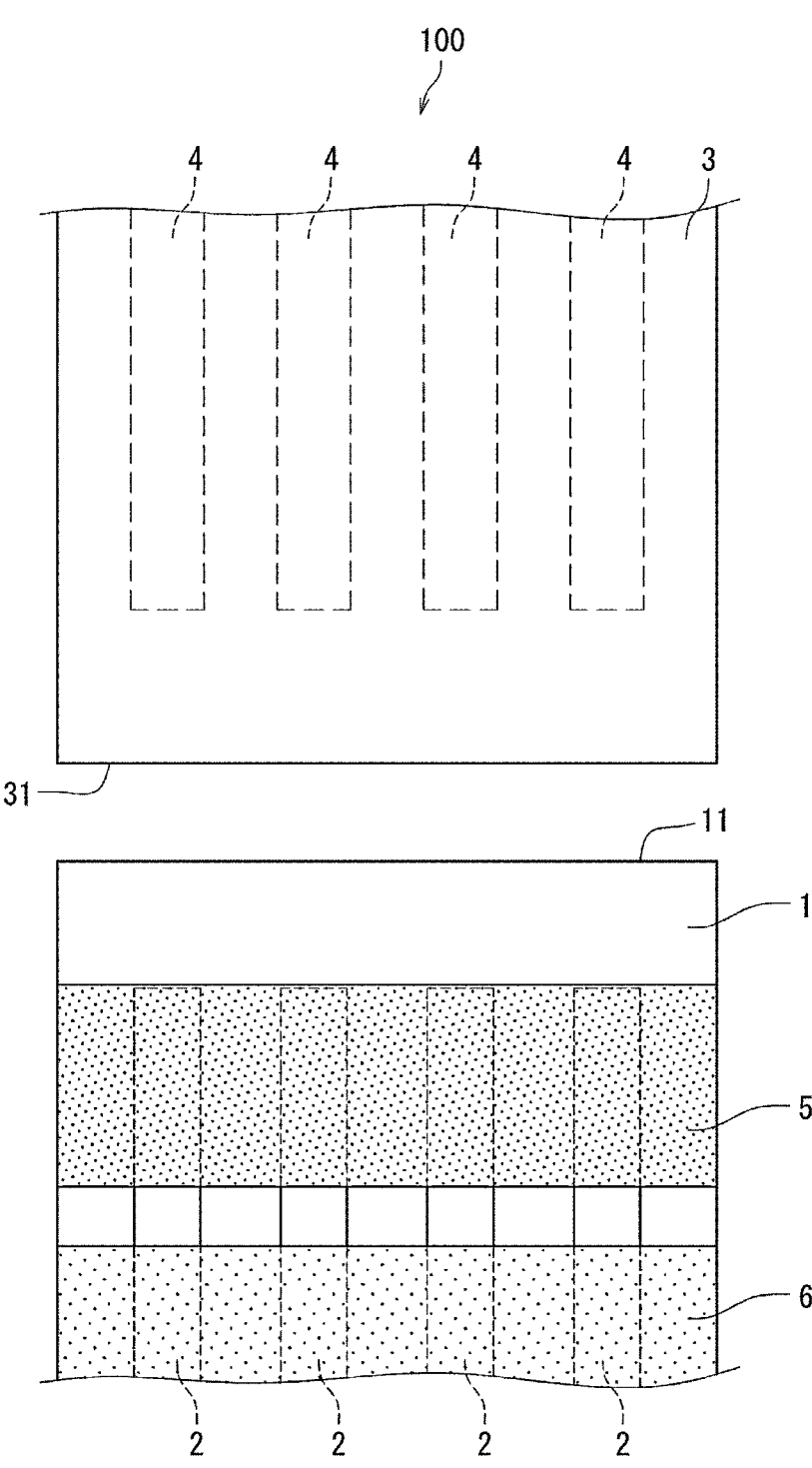
FIG. 2 is an exploded plan view schematically illustrating the stretchable device according to the first embodiment of the present disclosure.

A structure of a stretchable device 100 according to a first embodiment will be described with reference to FIGS. 1A, 1B, and 2. FIG. 1A is a partial top view of the stretchable device 100. FIG. 1B is a sectional view of the stretchable device 100 taken along line A-A in FIG. 1A. FIG. 2 is an exploded plan view of the stretchable device 100. The sectional views in the present specification are sectional views that are parallel to a first direction and include a region where a first substrate 1 and a second substrate 3 overlap as viewed from the first direction that is a thickness direction of the first substrate. The first direction is indicated by a double-headed arrow X in FIG. 1B. As illustrated in FIG. 1B, the thickness direction of the first substrate 1, the thickness direction of the second substrate 3, and the first direction coincide with each other.

The stretchable device 100 includes the first substrate 1, the second substrate 3, a first wiring 2, a second wiring 4, a connection member 5, and a first protective layer 6. The first substrate 1 and the second substrate 3 are connected to each other with the connection member 5 interposed therebetween. More specifically, the first wiring 2 provided on the first substrate 1 and the second wiring 4 provided on the second substrate 3 are electrically connected to each other with the connection member 5 interposed therebetween. The first protective layer 6 is disposed between the second substrate 3 and the first wiring 2 in the first direction. In FIGS. 1A and 2, the connection member 5 and the first protective layer 6 are indicated by dot hatching for convenience.

Note that the shape of the stretchable device 100 is not particularly limited. In the present specification, the structure in which the two substrates are connected is described as an example, but three or more substrates may be connected. In addition, the first wiring 2 is not limited to the arrangement as illustrated in FIG. 1, and the extending direction is also not limited. Specifically, the longitudinal direction of the first substrate 1 and the extending direction of the first wiring 2 may not coincide with each other, or the first substrate 1 and the first wiring 2 may not extend in one direction. The number of first wirings 2 is not particularly limited, and may be one or more. In a case where the number of the first wirings 2 is plural, the first wirings 2 may include a wiring not electrically connected to the second wiring 4. The same applies to the arrangement and number of second wirings 4.

In addition, the term "on" in the present specification may not coincide with the upper and lower sides when the stretchable device 100 is used. More specifically, as illustrated in FIG. 1, since the first wiring 2 and the second wiring 4 can be electrically connected, the term "on the first substrate 1" refers to a main surface side of the first substrate 1 close to the second substrate 3, and the term "on the second substrate 3" refers to a main surface side of the second substrate 3 close to the first substrate 1. Furthermore, "above" with respect to a certain element includes not only an upper position away from the element, that is, an upper position with another object interposed therebetween on the element or an upper position at an interval, but also a position in contact with and immediately above (on) the element.

These constituent elements and the arrangement thereof will be described below. As illustrated in FIGS. 1A, 1B, and 2, the first substrate 1 and the second substrate 3 face each other in the first direction, and a part of the first substrate 1 and a part of the second substrate 3 overlap each other as viewed from the first direction. Similarly, the first wiring 2 and the second wiring 4 face each other in the first direction.

The first substrate 1 is preferably a stretchable substrate. Since the first substrate 1 is stretchable, it is possible to reduce the risk of breakage due to expansion and contraction at the time of use of the stretchable device 100 without suppressing expansion and contraction of the first wiring 2.

Examples of the stretchable substrates include sheet-shaped or film-shaped substrates made of a stretchable resin material. Examples of the resin material include thermoplastic polyurethane. The thickness of the stretchable substrate 1 is not particularly limited, but is preferably 1 mm or less, more preferably 100 μm or less, still more preferably 50 μm or less from the viewpoint of preventing stretching of a surface of a living body from being impaired when the stretchable substrate 1 is attached to the living body. Further, the thickness of the stretchable substrate 1 is preferably 1 μm or more.

The first substrate 1 may not be stretchable. Specific examples of the first substrate 1 include a sheet-shaped or film-shaped substrate made of PET, polyimide, or the like, and a substrate for a flexible printed circuit (FPC), a flexible flat cable (FFC), a printed circuit board (PCB), or the like.

The first substrate 1 has a first substrate end portion 11. The first substrate end portion 11 is an end portion of the first substrate 1 closer to the second substrate 3, in other words, an end portion overlapping the second wiring 4 as viewed from the first direction. Specifically, it is an end portion closer to the second substrate 3 among both end portions in the vertical direction in FIG. 1A, and is an end portion closer to the second substrate 3 among both end portions in the horizontal direction in FIG. 1B. In FIGS. 1A and 1B, the end portion different from the first substrate end portion 11 is not illustrated.

The first wiring 2 is stretchable, and examples of the first wiring 2 include a mixture of metal powders such as Ag, Cu, and Ni as conductive particles and an elastomer-based resin such as a silicone resin. The average diameter of the conductive particles is not particularly limited, but is preferably 0.01 μm to 10 μm. The shapes of the conductive particles are preferably spherical. The thickness, width, and length of the first wiring are not particularly limited.

The second substrate 3 has a Young's modulus larger than that of the first wiring 2. The second substrate 3 may not be stretchable. Specific examples of the second substrate 3 include substrates such as an FPC, an FFC, and a PCB. By making the Young's modulus larger than that of the first wiring 2, a pressure is easily applied to a bonding portion at the time of pressure bonding, and bonding can be performed with a low pressure. That is, by reducing the pressure, damage to the substrate at the time of bonding can be reduced. In addition, it is preferable that it have a Young's modulus larger than that of the first substrate 1. Since it is resistant to an impact at the time of connection, connection reliability can be further improved.

The second substrate 3 has a second substrate end portion 31. The second substrate end portion 31 is an end portion of the second substrate 3 closer to the first substrate 1, in other words, an end portion overlapping the first wiring 2 as viewed from the first direction. Specifically, it is an end portion closer to the first substrate 1 among both end portions in the vertical direction in FIG. 1A, and is an end portion closer to the first substrate 1 among both end portions in the horizontal direction in FIG. 1B. In FIGS. 1A and 1B, the end portion different from the second substrate end portion 31 is not illustrated.

As described above, since the second substrate 3 has a Young's modulus higher than that of the first wiring 2, the first wiring 2 may be broken when the first wiring 2 and the second substrate 3 are in direct contact with each other. In addition to the breaking due to the direct contact, stretching performance at a portion where the second substrate 3 is in contact greatly decreases, and thus the portion may become a stress concentration point at the time of stretching and break.

The second wiring 4 is a wiring having a Young's modulus larger than that of the first wiring 2. Examples of the second wiring include metal wirings such as copper foil. The thickness of the wiring is preferably 1 μm to 100 μm.

As described above, the connection member 5 electrically connects the first wiring 2 and the second wiring 4. Examples of the connection member 5 include an anisotropic conductive film (ACF), a conductive paste, and solder. The connection member 5 preferably contains a resin and conductive particles. When the conductive particles contained in the connection member 5 come into contact with the first wiring 2 and the second wiring 4, the first wiring 2 and the second wiring 4 are electrically connected. In addition, since the resin contained in the connection member 5 covers the first wiring 2, exposure of the first wiring 2 is reduced, and contact between the first wiring 2 and the second substrate 4 can be suppressed.

The first protective layer 6 is disposed between the second substrate 3 and the first wiring 2 in the first direction. Specifically, the first protective layer 6 covers a part of the first wiring 2 and overlaps the second substrate end portion 31 as viewed from the first direction. With the arrangement, it is possible to reduce contact between the second substrate 3 and the first wiring 2 and to suppress breakage of the first wiring 2.

Specifically, the second substrate 3 may be deformed toward the first substrate 1 due to an external force or pressure bonding to be described later. At this time, in a case where the first wiring 2 is exposed, the first wiring 2 may be broken due to contact between the first wiring 2 and the second substrate 3. By providing the first protective layer 6, contact between the first wiring 2 and the second substrate 3 can be suppressed.

Specifically, the first protective layer 6 is preferably a resin material or a mixture of a resin material and an inorganic material as an example, and examples of the resin material include elastomer-based resins such as urethane-based, styrene-based, olefin-based, silicone-based, fluorine-based, nitrile rubber, latex rubber, vinyl chloride, ester-based, and amide-based resins, epoxy, phenol, acrylic, polyester, imide-based, rosin, cellulose, polyethylene terephthalate-based, polyethylene naphthalate-based, and polycarbonate-based resins. In addition, the first protective layer 6 preferably has insulating properties. Since the first protective layer 6 has insulating properties, ion migration in the first wiring 6 can be more reliably suppressed. The first protective layer 6 may be made of the same material as that of the first substrate 1.

The first protective layer 6 includes a first protective layer upper surface 61 closest to the second substrate 3, a first protective layer lower surface 62 closest to the first substrate 1, and a first protective layer end surface 63 connecting the first protective layer upper surface 61 and the first protective layer lower surface 62. The first protective layer end surface 63 is a surface closest to an end portion of the first wiring 2 among surfaces connecting the first protective layer upper surface 61 and the first protective layer lower surface 62. The first protective layer upper surface 61 corresponds to an upper surface in the claims, the first protective layer lower surface 62 corresponds to a lower surface in the claims, and the first protective layer end surface 63 corresponds to an end surface in the claims.

The thickness of the first protective layer 6 is preferably 1 μm to 100 μm, and more preferably 50 μm or less. By setting the thickness of the first protective layer 6 to 1 μm or more, contact between the first wiring 2 and the second substrate 3 can be suppressed. By setting the thickness of the first protective layer 6 to 100 μm or less, the height of the first protective layer 6 as a whole can be reduced. In a case where the thickness of the first protective layer 6 is not constant, the maximum dimension of the first protective layer 6 in the first direction is defined as the thickness.

Therefore, the stretchable device 100 in which breakage of the first wiring 2 is suppressed is provided, which includes: the first substrate 1; the stretchable first wiring 2 provided on the first substrate 1; the second substrate 3 facing the first substrate 1 in the first direction that is the thickness direction of the first substrate 1; the second wiring 4 provided on the second substrate 3 and facing the first wiring 2 in the first direction; the connection member 5 electrically connecting the first wiring 2 and the second wiring 4; and the first protective layer 6 disposed at least between the second substrate 3 and the first wiring 2 in the first direction.

The first protective layer 6 is preferably provided not on the second substrate 3 but on the first substrate 1. Since the first protective layer 6 is provided on the first substrate 1, the first protective layer 6 can be disposed continuously with a portion not overlapping the second substrate 3 as viewed from the first direction. Therefore, it is possible to reduce the risk of misalignment due to stretching. The first protective layer 6 may be disposed on the second substrate 3 and between the second substrate 3 and the first wiring 2 in the first direction X.

The first protective layer 6 is preferably disposed between the second substrate end portion 31 and the first wiring 2 in the first direction. As described above, the second substrate end portion 31 includes a corner portion. The corner portion is an intersection portion of the end surface and the lower surface. The corner portion may be a ridge line or a protruding curved surface. Since the corner portion has a large effect when being in contact with the first wiring 2 due to its shape, the breakage of the first wiring 2 can be further suppressed by disposing the first protective layer 6 between the second substrate end portion 31 and the first wiring 2 in the first direction.

In addition, the entire first wiring 2 is preferably covered with the connection member 5 or the first protective layer 6 in a region where the second substrate 3 and the first wiring 2 overlap as viewed from the first direction. With the above-described configuration, it is possible to reduce contact between the first wiring 2 and the second substrate 3. In addition, moisture may enter from a portion where the first wiring 2 is exposed, and ion migration may occur. The above-described arrangement can suppress ion migration.

In addition, it is preferable that a connection region 7 in which the first wiring 2 and the second wiring 4 overlap as viewed from the first direction be provided. In the connection region 7, the first wiring 2 and the second wiring 4 are electrically connected, and connection reliability can be improved.

A dimension of the connection region 7 is not particularly limited, but is preferably 0.5 mm to 20 mm. In a case where the connection region 7 is 0.5 mm or more, the connection area is increased, and the connection reliability is improved. Meanwhile, since the stretchability of a portion of the stretchable wiring 2 in contact with the connection member is reduced, the connection region is 20 mm or less, so that it is possible to suppress a decrease in the stretching performance of the stretchable device 100. That is, by setting the connection region to 0.5 μm to 20 mm, it is possible to provide the stretchable device 100 with high connection reliability in which a decrease in the stretching performance is suppressed.

Note that the dimension of the connection region 7 described above is a dimension in the vertical direction in FIG. 1A and the horizontal direction in FIG. 1B. As illustrated in FIG. 1A, the connection region 7 has the dimension in the width direction of the first wiring 2 and the second wiring 4. In addition, as illustrated in FIG. 1A, a plurality of connection regions 7 may be provided. In FIG. 1B, the connection member 5 is disposed in the entire connection region 7, but may be disposed in at least a part of the connection region 7. As illustrated in FIG. 1B, a void may or may not be provided between the connection member 5 and the second substrate 3.

Next, connection of the stretchable device 100 will be described. When the first substrate 1 and the second substrate 3 are to be connected, the first substrate 1 and the second substrate 2 may be subjected to pressure bonding such as pressurization. By performing such processing, the connection member 5 is deformed, and the entire thickness changes. That is, the height of the stretchable device 100 can be reduced. In particular, in a case where the connection member 5 contains a resin, the tendency is remarkable. In addition, as described above, in a case where the connection member 5 contains conductive particles, conduction cannot be achieved if the distance between the first wiring 2 and the second wiring 4 in the first direction is larger than the maximum diameter of the conductive particles. In such a case, the distance between the first wiring 2 and the second wiring 4 in the first direction is reduced by performing the above-described pressure bonding. Therefore, the first wiring 2 and the second wiring 4 can be electrically connected more reliably.

In a case where the first wiring 2 and the second wiring 4 are electrically connected before pressure bonding, pressurization may not be performed. In a case where the connection member 5 has adhesiveness, pressurization may not be performed. The pressure bonding method is not particularly limited.

First Modification of First Embodiment

Figure 3:
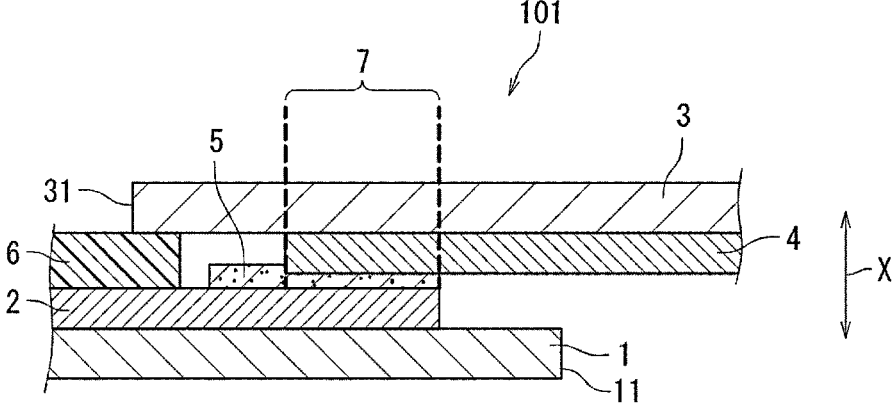
FIG. 3 is a sectional view of a stretchable device according to a first modification of the first embodiment of the present disclosure.

FIG. 3 is a sectional view of a stretchable device 101 according to a first modification of the first embodiment. The stretchable device is different from the stretchable device 100 according to the first embodiment in the arrangement of the second substrate 3. Specifically, the second substrate 3 and the first protective layer 6 are in contact with each other.

As described above, the stretchable device 101 may be subjected to processing such as pressure bonding. FIG. 3 illustrates a structure of the stretchable device 101 after pressure bonding. Due to the pressure bonding, the thickness of the connection member 5 is changed, and the height of the connection member 5 is reduced. In addition, the second substrate 3 and the protective layer 6 are in contact with each other.

As described above, the first protective layer 6 may be in contact with the first substrate 3. That is, it is possible to provide the stretchable device 101 that suppresses breakage of the first wiring 2 and achieves a reduction in the height.

In the stretchable device 101, the first wiring 1 and the second substrate 3 may be in contact with each other before deformation due to pressure bonding or an external force.

Similarly, the first wiring 1 and the second substrate 3 may not be in contact with each other after the pressure bonding.

Second Modification of First Embodiment

Figure 4:
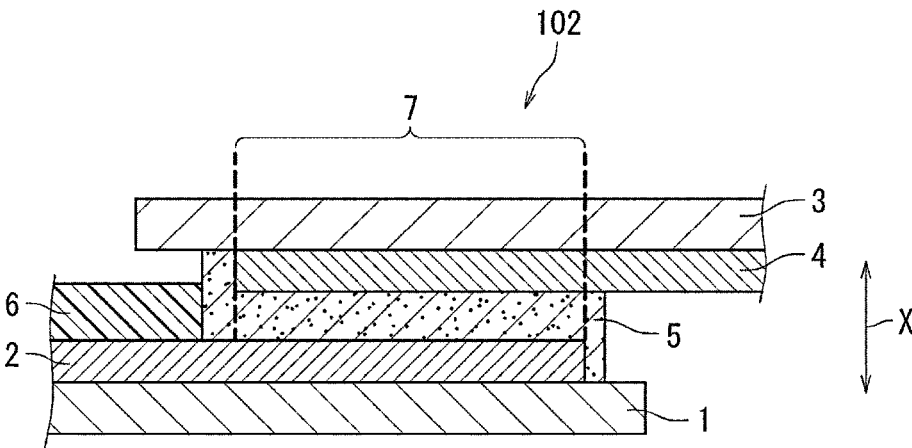
FIG. 4 is a sectional view of a stretchable device according to a second modification of the first embodiment of the present disclosure.

A second modification of the first embodiment will be described below with reference to FIG. 4. FIG. 4 is a partial sectional view of a stretchable device 102 according to the second modification of the first embodiment. The stretchable device 102 is different from the stretchable device 100 according to the first embodiment in that the connection member 5 and the first protective layer 6 are in contact with each other.

The connection member 5 and the first protective layer 6 are preferably in contact with each other. With the arrangement, deformation of the connection member 5 on the first protective layer 6 side is suppressed. In other words, the connection member 5 can maintain a constant thickness on the first substrate 1 side where the first protective layer 6 is located. Since the first wiring is stretchable, the first wiring can expand and contract in the left-right direction in FIG. 4. In this case, it is conceivable that the connection member 5 is further deformed by the expansion and the contraction. In this case, in a case where the connection member 5 does not have a sufficient thickness, the connection may be broken by the expansion and the contraction. Since the connection member 5 has a constant thickness on the first wiring 3 side in the left-right direction in FIG. 4, it is possible to suppress a connection failure due to misalignment due to the expansion and the contraction. In addition, since the thickness of the connection member is sufficient, the connection reliability can be improved.

In addition, in a case where the connection member 5 contains a resin, deformation may occur more than necessary depending on the viscosity of the resin. Since the first protective layer 6 and the connection member 5 are in contact with each other, the connection member 5 can be selected without being limited by the viscosity. Note that the arrangement of the connection member 5 is not limited to that as in FIG. 4.

In addition, at least a portion of the second wiring 4 preferably does not overlap the connection member 5 in a region where the first substrate 1 and the second wiring 4 overlap as viewed from the first direction.

In other words, the second wiring 4 is exposed from the connection member 5 in a region where the second wiring 4 overlaps the first substrate 1 as viewed from the first direction. With the arrangement, there is room for the connection member 5 to be deformed to the second substrate 3 side, so that the connection member 5 can be sufficiently deformed. That is, this improves the connection reliability.

By combining the above-described two configurations, it is possible to provide the stretchable device 102 with high connection reliability in which the connection member 5 on the stretchable first wiring 2 side is kept sufficiently thick by suppressing deformation and there is room for deformation of the connection member 5 on the second wiring side.

As illustrated in FIG. 4, the first protective layer 6 and the connection member 5 may be in contact with each other before the connection member 5 is deformed due to pressure bonding or the like. With the configuration, it is possible to further suppress deformation of the connection member 5. Note that the first protective layer 6 and the connection member 5 may be separated from each other before pressure bonding, and the first protective layer 6 and the connection member 5 may be disposed to be in contact with each other due to deformation of the connection member 5 due to pressure bonding.

As illustrated in FIG. 4, the connection member 5 may be disposed in a portion other than the connection region, or may be in direct contact with the first substrate 1 or the second substrate 3.

As illustrated in FIG. 4, in a case where the first protective layer 6 and the second substrate 3 are separated from each other in the first direction, there is a possibility that the connection member 5 enters between the first protective layer 6 and the second substrate 3 by being deformed due to pressure bonding. In other words, it is possible to leave room for deformation of the connection member 5 on the upper surface of the first protective layer 6 while securing the thickness of the first protective layer 6. Therefore, the stretchable device 102 with improved connection reliability can be provided.

Third Modification of First Embodiment

A stretchable device 103 according to a third modification of the first embodiment will be described below with reference to FIG. 5. The stretchable device 103 is different from the stretchable device 100 according to the first embodiment in the arrangement of the connection member 5 and the first protective layer 6.

Figure 5:
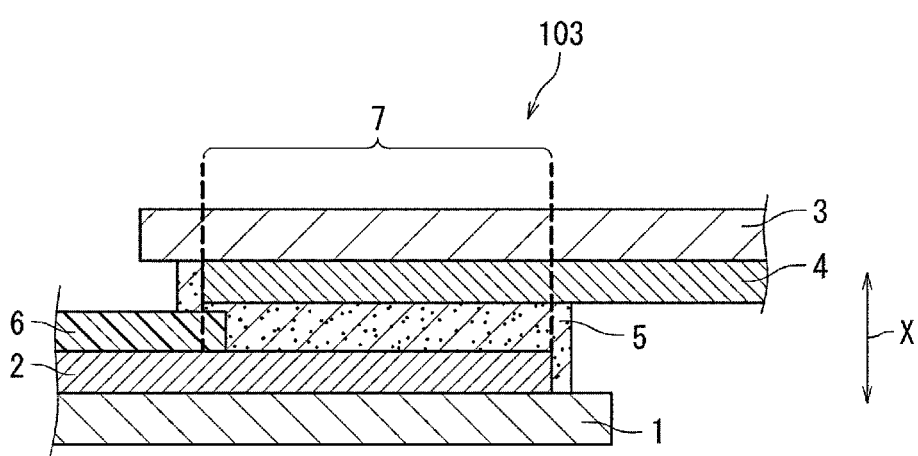
FIG. 5 is a sectional view of a stretchable device according to a third modification of the first embodiment of the present disclosure.

FIG. 5 is a sectional view illustrating the stretchable device 103. As illustrated in FIG. 5, the connection member 5 and the first protective layer 6 may be disposed so as to overlap each other as viewed from the first direction.

In a case where the connection member 5 and the first protective layer 6 overlap each other as viewed from the first direction, the connection member 5 is disposed on the upper surface of the first protective layer 6. The contact area is increased as compared with a case where the connection member 5 is in contact with only the end surface of the first protective layer 6. As a result, the connection reliability can be improved.

That is, it is preferable that the first protective layer 6 and the connection member 5 overlap each other as viewed from the first direction. In other words, the connection member 5 is preferably disposed on the upper surface 61 of the first protective layer 6. A conductive member 4 is preferably disposed between the second substrate 3 and the first protective layer 6 in the first direction.

Fourth Modification of First Embodiment

A stretchable device 104 according to a fourth modification of the first embodiment will be described below with reference to FIG. 6. The stretchable device 104 is different from the stretchable device 100 according to the first embodiment in the first protective layer 6.

As described above, the first protective layer 6 includes a first protective layer upper surface 61 closest to the second substrate 3, a first protective layer lower surface 62 closest to the first substrate 1, and a first protective layer end surface 63 connecting the first protective layer upper surface 61 and the first protective layer lower surface 62.

In a sectional view, an angle formed by the first protective layer end surface 63 and the first protective layer lower surface is preferably an acute angle. In other words, the first protective layer lower surface 62 preferably has a region that does not overlap the first protective layer upper surface 61 as viewed from the first direction.

With the arrangement, the connection member 5 can be easily disposed on the first protective layer upper surface 61 when the connection member 5 is deformed due to pressure bonding, and the connection reliability can be improved.

Preferably, as viewed from the first direction, the first protective layer lower surface 62 overlaps the second wiring 4 and the first protective layer upper surface does not overlap the second wiring 4.

Figure 6:
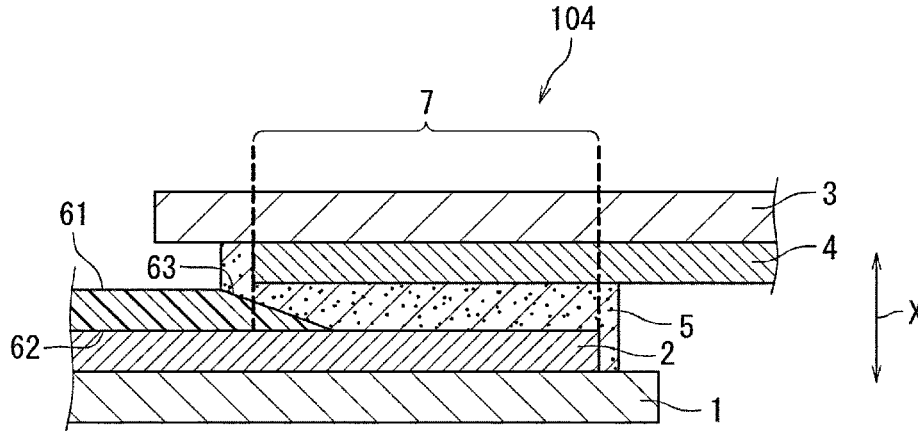
FIG. 6 is a sectional view of a stretchable device according to a fourth modification of the first embodiment of the present disclosure.

In other words, as illustrated in FIG. 6, preferably, as viewed from the first direction, the first protective layer lower surface 62 overlaps the connection region 7 and the first protective layer upper surface 61 does not overlap the connection region 7.

With the arrangement, the resin arranged in the connection region 7 moves to the first protective layer upper surface 61 along the first protective layer end surface 63, so that the connection reliability can be improved. Further, when the connection member 5 is deformed due to pressure bonding or the like, the connection member 5 can be more efficiently moved to the first protective layer upper surface 61.

Fifth Modification of First Embodiment

A stretchable device 105 according to a fifth modification of the first embodiment will be described below with reference to FIG. 7. The stretchable device 105 is different from the stretchable device 100 according to the first embodiment in that the stretchable device 105 includes an insulating layer 9.

Figure 7:
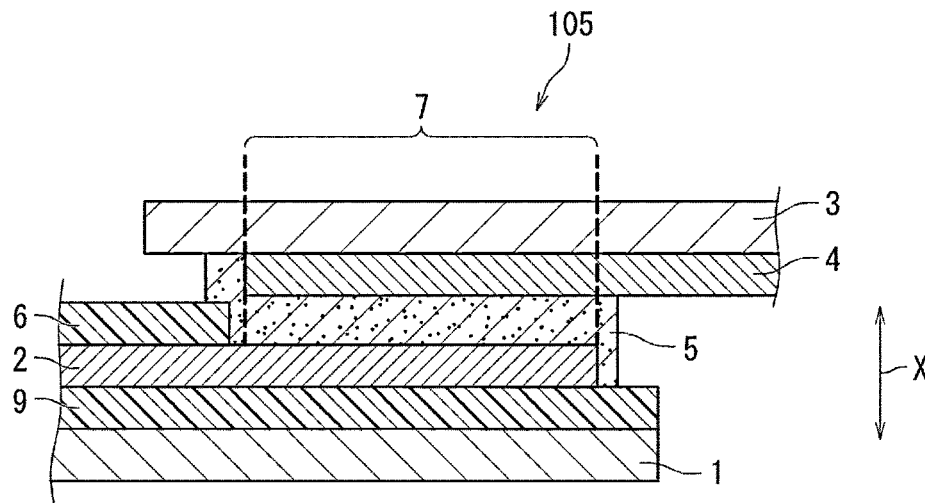
FIG. 7 is a sectional view of a stretchable device according to a fifth modification of the first embodiment of the present disclosure.

As illustrated in FIG. 7, the insulating layer 9 is preferably provided between the first substrate 1 and the first wiring 2.

The insulating layer 9 is a resin formed by printing. More specifically, it is preferably a resin material or a mixture of a resin material and an inorganic material, and examples of the resin material include elastomer-based resins such as urethane-based, styrene-based, olefin-based, silicone-based, fluorine-based, nitrile rubber, latex rubber, vinyl chloride, ester-based, and amide-based resins, and epoxy, phenol, acrylic, polyester, imide-based, rosin, cellulose, polyethylene terephthalate-based, polyethylene naphthalate-based, and polycarbonate-based resins. Note that the insulating layer 9 may not be a single material. The first protective layer 6 and the insulating layer 9 may be the same member.

As illustrated in FIG. 7, the insulating layer 9 is disposed between the first substrate 1 and the first wiring 2 in the first direction. In other words, it is provided on the first substrate 1 and is in contact with the lower surface of the first wiring 2.

In a case where the first substrate 1 has moisture permeability, moisture may enter from the first substrate 1 to the first wiring 2, and ion migration may occur. By providing the insulating layer 9, entry of moisture from the first substrate 1 to the first wiring 2 can be suppressed. That is, the stretchable device 105 in which a short circuit of the first wiring 2 is suppressed is provided.

For example, the insulating layer 9 may be disposed so as to cover only the lower surface of the first wiring 2, or may be disposed at a portion where the first wiring 2 of the first substrate 1 is not present. Similarly, it may be disposed so as to cover the entire first substrate 1. In addition, it is sufficient that it is in contact with the second wiring 2, and a different layer may be disposed between the first substrate 1 and the insulating layer 9.

Sixth Modification of First Embodiment

A stretchable device 106 according to a sixth modification of the first embodiment will be described below with reference to FIGS. 8A to 8D. The stretchable device 106 is different from the stretchable device 100 according to the first embodiment in the first protective layer 6.

Figure 8A:
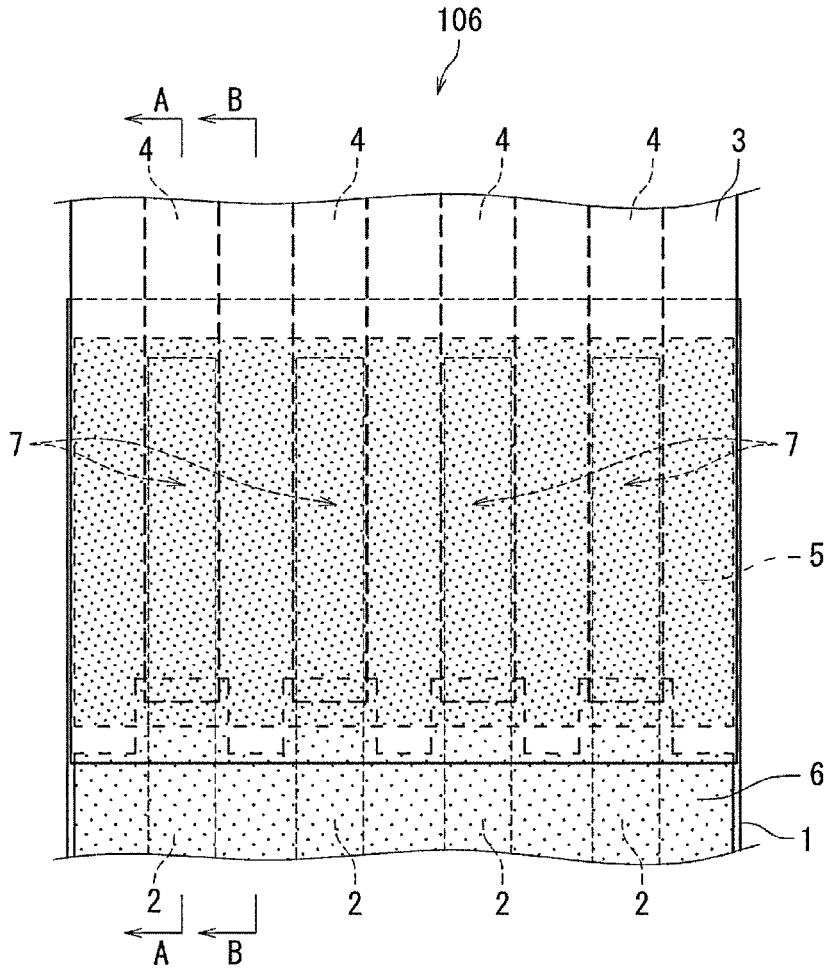
FIG. 8A is a partial enlarged top view of a stretchable device according to a sixth modification of the first embodiment of the present disclosure.
Figure 8B:
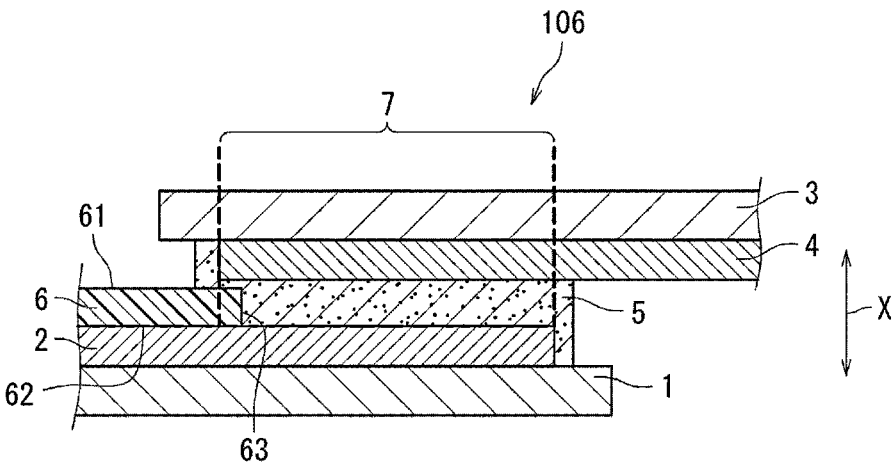
FIG. 8B is a sectional view taken along line A-A in FIG. 8A.
Figure 8C:
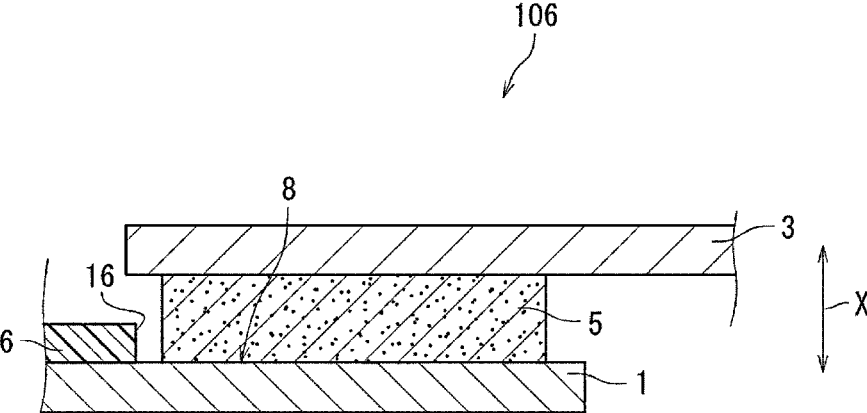
FIG. 8C is a sectional view taken along line B-B in FIG. 8A.
Figure 8D:
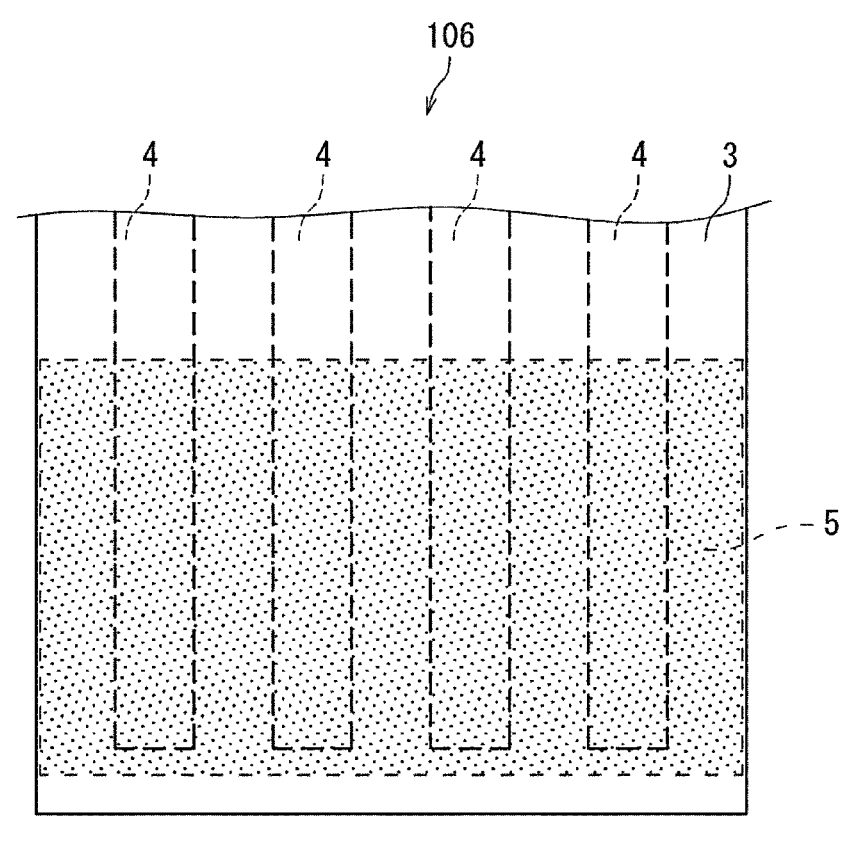
FIG. 8D is an exploded plan view of the stretchable device according to the sixth modification of the first embodiment of the present disclosure.
Figure 8D:
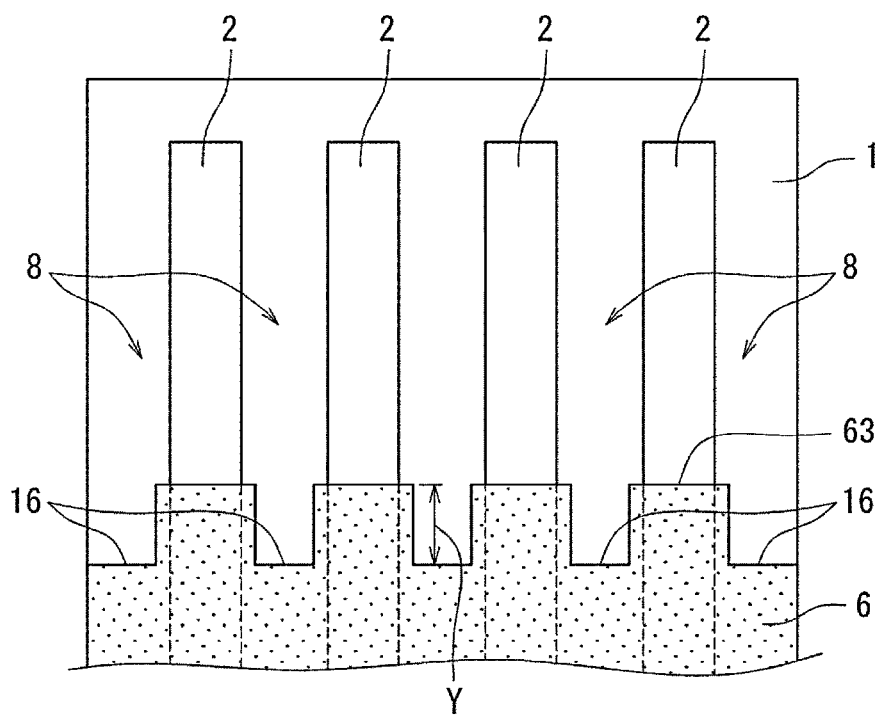

FIG. 8A is a partial top view of the stretchable device 106. FIG. 8B is a sectional view taken along line A-A in FIG. 8A. FIG. 8C is a sectional view taken along line B-B in FIG. 8A. FIG. 8D is an exploded plan view of the stretchable device 106. As illustrated in FIGS. 8A and 8D, the first protective layer 6 has irregularities in the vertical direction of the drawings. In FIGS. 8B and 8C, the connection member 5 and the first protective layer 6 are indicated by dot hatching for convenience.

A part of the first protective layer 6 is disposed in a non-wiring region 8 that does not overlap the first wiring 2 as viewed from the first direction. As viewed from the first direction, in the non-wiring region 8, the first protective layer 6 preferably has a recessed portion 16 on an end surface thereof. Specifically, the recessed portion 16 opens on the upper surface, the lower surface, and the end surface of the first protective layer 6.

More specifically, the first substrate 1 includes a region overlapping the first wiring 1 and a region not overlapping the first wiring 1 as viewed from the first direction. A region of the first substrate 1 that does not overlap the first wiring 1 as viewed from the first direction is indicated as the non-wiring region 8.

As described above, since the first wiring 2 is stretchable, by disposing the first protective layer 6, it is possible to suppress a decrease in the thickness of the connection member 5 and improve the connection reliability. On the other hand, since the non-wiring region 8 is a region that is less involved in the connection between the first wiring 2 and the second wiring 4, the first protective layer 6 that is a region in which the deformation of the connection member 5 does not need to be suppressed has the recessed portion 16 in the non-wiring region 8, so that it is possible to provide the stretchable device 106 with high connection reliability in which the connection member 5 can be deformed in the non-wiring region 8 while securing the thickness of the connection member 5 in the region where the first wiring 2 and the second wiring 4 are connected.

As illustrated in FIGS. 8A and 8D, the recessed portion 16 may be formed in a part of the non-wiring region 8 in the horizontal direction in the drawings, or the recessed portion 16 may be formed in the entire non-wiring region 8. In other words, in the width direction of the first wiring 2, the length of the recessed portion formed in the non-wiring region 8 may be equal to or shorter than the length of the non-wiring region 8.

The depth of the recessed portion 16 is preferably 50 μm or more. Note that the depth of the recessed portion 16 refers to the maximum length in the extending direction of the wirings in plan view, and refers to the length in the vertical direction in FIG. 8A. Specifically, it refers to the distance between the end surface 63 formed in the adjacent non-wiring region 8 and the end surface 63 formed in a region overlapping the first wiring 2 as viewed from the first direction, and is indicated by a double-headed arrow Y in FIG. 8D.

Preferably, a part of the first protective layer 6 is disposed in the non-wiring region 8, and the connection member 5 and at least a part of the first protective layer 6 are separated from each other in the non-wiring region 8.

The above-described configuration will be specifically described with reference to FIGS. 8B and 8C. FIG. 8B is a sectional view of a portion overlapping the first wiring as viewed from the first direction, that is, having the connection region 7. Since FIG. 8B is the same sectional view as FIG. 5, effects and detailed description thereof are omitted. Note that FIG. 5 is a sectional view of the stretchable device 103 according to the third modification of the first embodiment, but it goes without saying that the structure may be the same as that of other embodiments or modifications.

FIG. 8C is a sectional view of the non-wiring region 8. In a case where the connection member 5 and at least a part of the first protective layer 6 are separated from each other in the non-wiring region 8, deformation of the connection member 5 is not suppressed as illustrated in FIG. 8C. That is, this improves the connection reliability.

Second Embodiment

A stretchable device 107 according to a second embodiment will be described below with reference to FIG. 9. The stretchable device 107 is different from the stretchable device 100 according to the first embodiment in the configuration and arrangement of the first substrate 1.

In the stretchable device 107 according to the second embodiment, the first substrate 1 is stretchable. In addition, the Young's modulus of the second wiring 4 is larger than the Young's modulus of the first substrate 1.

In a case where the first substrate 1 is stretchable, since the Young's modulus of the first substrate 1 is low in addition to the effects described above, the first substrate 1 may be brought into contact with the second wiring 4. Since the Young's modulus of the first substrate 1 is low, the possibility of breakage due to contact can be reduced.

Figure 9:
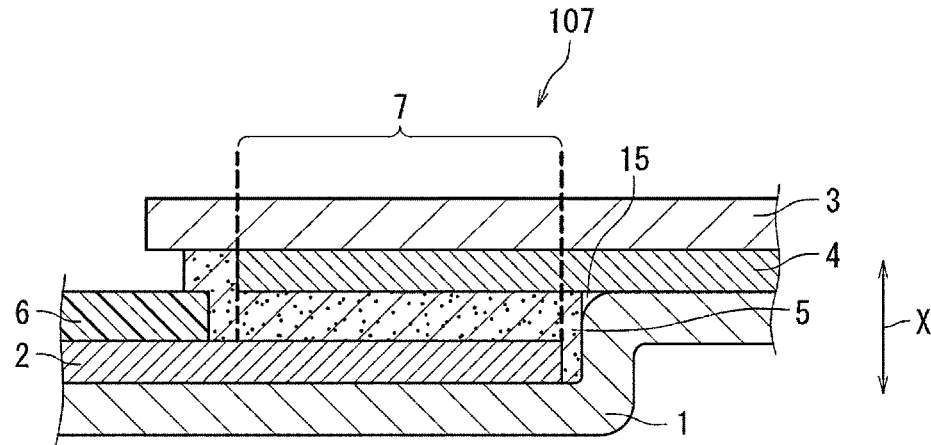
FIG. 9 is a sectional view of a stretchable device according to a second embodiment of the present disclosure.

As illustrated in FIG. 9, in the stretchable device 107 according to the second embodiment, the first substrate 1 is in contact with the second wiring 4. Although not illustrated, the first substrate 1 and the second substrate 3 may be in contact with each other in a region of the second substrate 3 where the second wiring 4 is not provided.

As illustrated in FIG. 9, when the first substrate 1 and the second wiring 4 are brought into contact with each other, the first substrate 1 is disposed between a portion of the second substrate 3 not overlapping the first wiring 2 and the connection region 7. The first substrate 1 can suppress entry of moisture into the connection region 7, that is, the first wiring 2.

That is, the first substrate 1 and the second wiring 4 are preferably in contact with each other. With the above configuration, it is possible to suppress entry of moisture and suppress a short circuit due to ion migration.

The arrangement of the first substrate 1 is not limited to the arrangement as illustrated in FIG. 9. Specifically, only the end portion of the first substrate 1 may be in contact with the second wiring 4. The first protective layer 6 and the second substrate 3 may be in contact with each other. Since the first protective layer 6 and the second substrate 3 are in contact with each other, entry of moisture can be further suppressed. In this case, by using a soft member for the first protective layer 6, it is possible to follow the shape of the second substrate 3.

As illustrated in FIG. 9, it is preferable that a void 15 be provided between the first substrate 1 and the connection member 5. Since the portion of the void 15 leaves room for deformation of the connection member 5, the connection reliability can be further improved.

The void 15 may not be disposed between the first substrate 1 and the connection member 5. As described above, since the stretchable first substrate 1 is soft, it is possible to follow the deformation of the connection member 5.

First Modification of Second Embodiment

Figure 10:
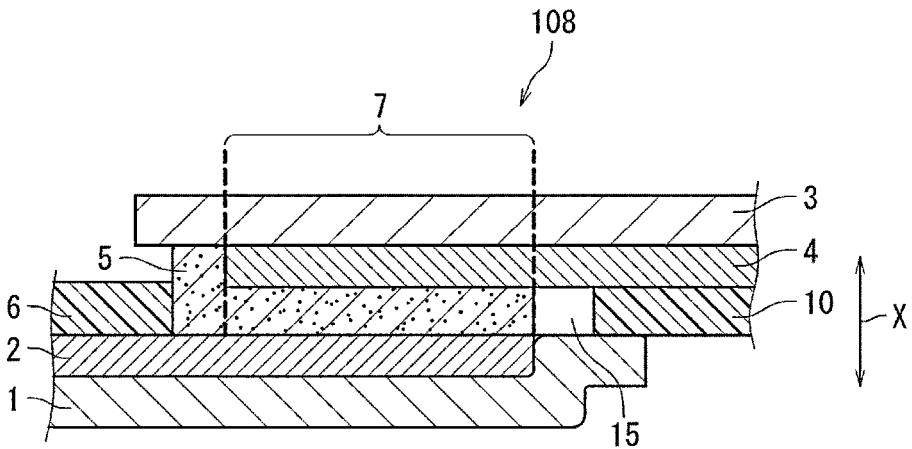
FIG. 10 is a partial sectional view of a stretchable device according to a first modification of the second embodiment of the present disclosure.

A stretchable device 108 according to a first modification of the second embodiment will be described below with reference to FIG. 10. The stretchable device 108 is different from the stretchable device 107 according to the second embodiment in that the stretchable device 108 includes a second protective layer 10.

More specifically, similarly to the first protective layer 6, the second protective layer 10 is preferably a resin material or a mixture of a resin material and an inorganic material, and examples of the resin material include elastomer-based resins such as urethane-based, styrene-based, olefin-based, silicone-based, fluorine-based, nitrile rubber, latex rubber, vinyl chloride, ester-based, and amide-based resin, and epoxy, phenol, acrylic, polyester, imide-based, rosin, cellulose, polyethylene terephthalate-based, polyethylene naphthalate-based, and polycarbonate-based resins. The first protective layer 6 and the second protective layer 10 may be the same member or different members.

Further, it is preferable that the second protective layer 10 covering the second wiring 4 be provided, and the second protective layer 10 and the first substrate 1 overlap in the first direction.

With the above-described configuration, direct contact between the first substrate 1 and the second wiring 4 can be suppressed, so that entry of moisture into the first wiring 1 can be suppressed.

In addition, the thickness of the second protective layer 10 is preferably 1 μm to 100 μm. As illustrated in FIG. 10, since the thickness of the second protective layer 10 and the thickness of the connection region 7 are substantially the same, the thickness of the connection region 7 can be adjusted by adjusting the thickness of the second protective layer. In addition, it is possible to suppress a short circuit due to foreign matter and ion migration.

In addition, it is sufficient that the second protective layer 10 and the first substrate 1 overlap each other in the first direction, and the second protective layer 10 and the first substrate 1 may be in contact with each other or may be separated from each other.

Preferably, the second protective layer 10 and the first substrate 1 are in contact with each other, and the void 15 is provided between the second protective layer 10 and the connection member 5.

As described above, the void 15 functions as a room for deformation of the connection member 5. Therefore, it is possible to improve the connection reliability while suppressing entry of moisture into the first wiring 2.

The size of the void is not particularly limited.

Second Modification of Second Embodiment

A stretchable device 109 according to a second modification of the second embodiment will be described below with reference to FIG. 11. The stretchable device 109 is different from the stretchable device 107 according to the second embodiment in that the stretchable device 109 includes a second protective layer 10.

Figure 11:
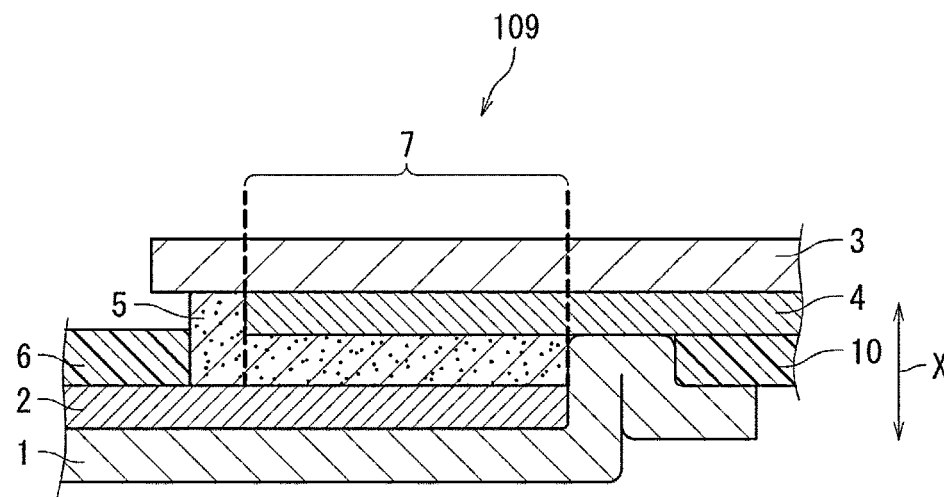
FIG. 11 is a partial sectional view of a stretchable device according to a second modification of the second embodiment of the present disclosure.

As illustrated in FIG. 11, it is preferable that the second protective layer 10 and the first substrate 1 be in contact with each other, and the first substrate 1 and the second wiring 4 be in contact with each other between the second protective layer 10 and the connection member.

As illustrated in FIG. 11, the first substrate 1 is in contact with the second protective layer 10 and the second wiring 4. More specifically, the stretchable first substrate 1 follows the void 15 illustrated in FIG. 10. As described above, since the first substrate 1 follows the deformation of the connection member 5, there is room for deformation of the connection member 5. That is, similarly to the stretchable device 108, it is possible to provide the stretchable device 109 with high connection reliability in which entry of moisture into the first wiring 1 is suppressed.

Third Embodiment

A stretchable device 110 according to a third embodiment will be described below with reference to FIG. 12. The stretchable device 110 is different from the stretchable device 100 according to the first embodiment in that the stretchable device 110 includes a third protective layer 12 and a fourth protective layer 13.

Figure 12:
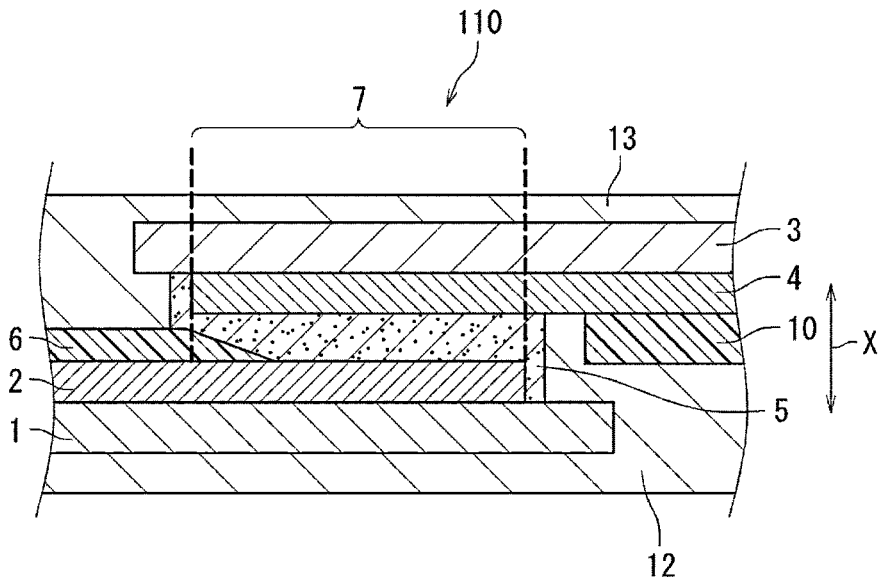
FIG. 12 is a partial sectional view of a stretchable device according to a third modification of the second embodiment of the present disclosure.

As illustrated in FIG. 12, the third protective layer 12 covering the main surface of the first substrate 1 on the side opposite to the first wiring 2 and the fourth protective layer 13 covering the main surface of the second substrate 3 on the side opposite to the second wiring 4 are provided.

Examples of the third protective layer 12 include a stretchable resin material. For example, the third protective layer 12 is formed of ionomer resin, polyester-based resin, styrene-based resin, olefin-based resin, epoxy-based resin, urethane-based resin, acryl-based resin, or silicone-based resin, and is preferably formed of urethane-based resin. Examples of the urethane-based resin include thermoplastic polyurethane (TPU). Examples of the styrene-based resin include styrene-butadiene-styrene copolymer resin (SBS). The third protective layer 12 may be formed of a plurality of members.

Examples of the fourth protective layer 13 include a stretchable resin material as an example of the fourth protective layer 13. For example, the fourth protective layer 13 is formed of ionomer resin, polyester-based resin, styrene-based resin, olefin-based resin, epoxy-based resin, urethane-based resin, acryl-based resin, or silicone-based resin, and is preferably formed of urethane-based resin. Examples of the urethane-based resin include thermoplastic polyurethane (TPU). Examples of the styrene-based resin include styrene-butadiene-styrene copolymer resin (SBS). The fourth protective layer 13 may be formed of a plurality of members. The third protective layer 12 and the fourth protective layer 13 may be the same member or different members.

The resin-containing members such as the first protective layer 6, the insulating layer 9, and the second protective layer 10 may have cytotoxicity. By providing the third protective layer 12, leakage of components having cytotoxicity can be suppressed. The same applies to the effect of the fourth protective layer 13. In addition, by providing the third protective layer 12 and the fourth protective layer 13, leakage of a component having higher cytotoxicity can be suppressed.

Note that the embodiments and the modifications are examples, and the present disclosure is not limited to the embodiments and the modifications. Each drawing illustrates an example of constituent elements, and does not limit shapes. Further, partial replacement or combination of configurations illustrated in different embodiments and variations is possible.

DESCRIPTION OF REFERENCE SYMBOLS

100 to 110: Stretchable device
1: First substrate
11: First substrate end portion
2: First wiring
3: Second substrate
31: Second substrate end portion
4: Second wiring
5: Connection member
6: First protective layer
61: First protective layer upper surface
62: First protective layer lower surface
63: First protective layer end surface
7: Connection region
8: Non-wiring region
9: Insulating layer
10: Second protective layer
12: Third protective layer
13: Fourth protective layer
15: Void
16: Recessed portion
X: First direction

The invention claimed is:

1. A stretchable device comprising:
a first substrate;
a stretchable first wiring on the first substrate;
a second substrate facing the first substrate in a first direction that is a thickness direction of the first substrate;
a second wiring on the second substrate and facing the first wiring in the first direction;
a connection member electrically connecting the first wiring and the second wiring;
a first protective layer at least between the second substrate and the first wiring in the first direction; and
a second protective layer covering the second wiring, wherein the second protective layer and the first substrate overlap in the first direction;
wherein the second protective layer and the first substrate are in contact with each other and define a void between the second protective layer and the connection member.

2. The stretchable device according to claim 1, wherein the first protective layer covers at least a part of the first wiring.

3. The stretchable device according to claim 1, wherein an entire portion of the first wiring overlapping the second substrate as viewed from the first direction is covered with at least one of the connection member or the first protective layer.

4. The stretchable device according to claim 1, wherein the first wiring and the second wiring overlap each other as viewed in the first direction and define a connection region, the connection region including at least a part of the connection member.

5. The stretchable device according to claim 4, wherein an entirety of the connection member is in the connection region.

6. The stretchable device according to claim 1, wherein at least a part of the second wiring does not overlap the connection member in a first region where the first wiring and the second wiring do not overlap within a second region where the first substrate and the second wiring overlap as viewed from the first direction.

7. The stretchable device according to claim 1, wherein the connection member and the first protective layer are in contact with each other.

8. The stretchable device according to claim 1, wherein the first protective layer and the connection member overlap as viewed from the first direction.

9. The stretchable device according to claim 1, wherein
the first protective layer has an upper surface closest to the second substrate, a lower surface in contact with the stretchable first wiring, and an end surface connecting the upper surface and the lower surface, and
the lower surface overlaps the second wiring as viewed from the first direction, and the upper surface does not overlap the second wiring as viewed from the first direction.

10. The stretchable device according to claim 1, wherein
a part of the first protective layer is in a non-wiring region where the first protective layer does not overlap the first wiring on the first substrate as viewed from the first direction, and
the first protective layer has a recessed portion in the non-wiring region.

11. The stretchable device according to claim 1, wherein the first protective layer has insulating properties.

12. The stretchable device according to claim 1, further comprising an insulating layer between the first substrate and the first wiring.

13. The stretchable device according to claim 1, wherein the first substrate and the second wiring are in contact with each other.

14. A stretchable device comprising:
a first substrate;
a stretchable first wiring on the first substrate;
a second substrate facing the first substrate in a first direction that is a thickness direction of the first substrate;
a second wiring on the second substrate and facing the first wiring in the first direction;
a connection member electrically connecting the first wiring and the second wiring;
a first protective layer at least between the second substrate and the first wiring in the first direction; and
a second protective layer covering the second wiring, wherein the second protective layer and the first substrate overlap in the first direction;
wherein the second protective layer and the first substrate are in contact with each other, and
the first substrate and the second wiring are in contact with each other in a region between the second protective layer and the connection member.

15. The stretchable device according to claim 1, further comprising a third protective layer covering a main surface of the first substrate on a side thereof opposite to the first wiring.

16. The stretchable device according to claim 15, further comprising a fourth protective layer covering a main surface of the second substrate on a side thereof opposite to the second wiring.

17. The stretchable device according to claim 1, further comprising a fourth protective layer covering a main surface of the second substrate on a side thereof opposite to the second wiring.

18. The stretchable device according to claim 1, wherein the connection member contains a plurality of conductive particles.

19. The stretchable device according to claim 1, wherein the first substrate and the second wiring are in contact with each other in a region between the second protective layer and the connection member.

20. The stretchable device according to claim 14, further comprising a third protective layer covering a main surface of the first substrate on a side thereof opposite to the first wiring.

\* \* \* \* \*